United States Patent [19]
Baumann et al.

[11] Patent Number: 5,408,497
[45] Date of Patent: Apr. 18, 1995

[54] TRANSCEIVER FOR TRANSMITTING AND RECEIVING STAIR-STEPPED SINUSOIDAL WAVEFORMS

[75] Inventors: Donald D. Baumann, San Jose; Stephen F. Dreyer, Los Altos; Kurt A. Stoll, Fremont, all of Calif.

[73] Assignee: Echelon Corporation, Palo Alto, Calif.

[21] Appl. No.: 92,252

[22] Filed: Jul. 14, 1993

[51] Int. Cl.⁶ ............................................. H04B 1/38
[52] U.S. Cl. ........................................ 375/7; 375/36; 370/116; 340/825.68; 327/126; 327/129
[58] Field of Search ..................................... 375/7–8, 375/36, 55, 71, 76, 120, 121; 455/73, 78; 328/14; 307/261; 370/116; 340/825.77, 825.78, 825.43, 825.68

[56] References Cited

U.S. PATENT DOCUMENTS

| | | | |
|---|---|---|---|
| 4,563,548 | 1/1986 | Misherghi et al. | 307/261 |
| 4,896,333 | 1/1990 | Can | 375/7 |
| 4,977,334 | 12/1990 | Handler | 307/261 |
| 5,237,561 | 8/1993 | Pyhalammi | 375/8 |

*Primary Examiner*—Stephen Chin
*Assistant Examiner*—Young Tse
*Attorney, Agent, or Firm*—Blakely, Sokoloff, Taylor & Zafman

[57] ABSTRACT

A transceiver for transmitting and receiving digital data represented as stair-stepped sinusoidal waveforms over twisted pair lines interconnecting nodes of a network. The transmitter of the transceiver converts square waves into the stair stepped sinusoidal waveforms by utilizing a number of current sources for supplying differing amounts of current to a resistor coupled across the twisted pair lines. Shift registers control a set of switches which control the direction and the amount of current flowing through the resistor. Thereby, the output voltage across the resistor can be controlled to produce the stair-stepped sinusoidal waveform by clocking the digital signal to the shift registers. The receiver of the transceiver re-converts received stair-stepped sinusoidal waveforms back to their respective digital signals.

22 Claims, 11 Drawing Sheets

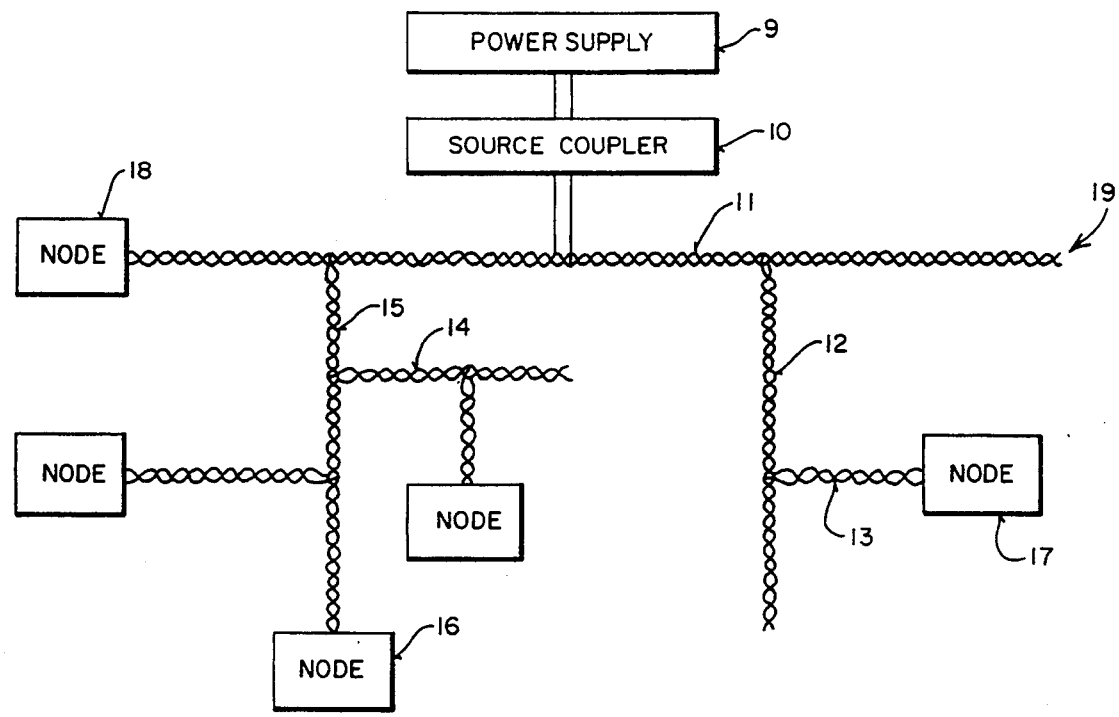
FIG_1
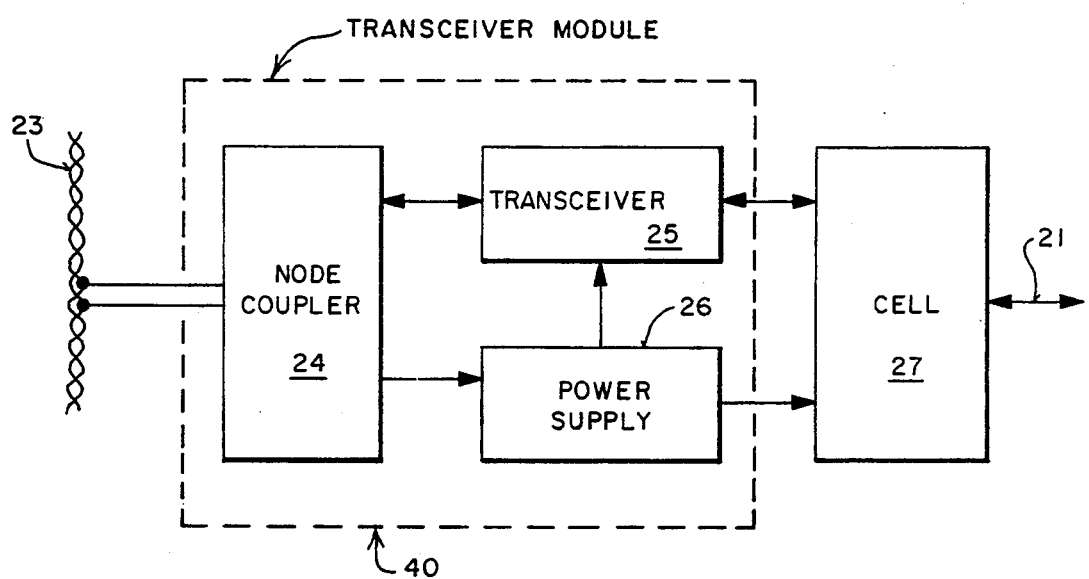
FIG_2

TRANSCEIVER FOR TRANSMITTING AND RECEIVING STAIR-STEPPED SINUSOIDAL WAVEFORMS

FIELD OF THE INVENTION

The present invention pertains to the field of transceivers and transceiver modules, More particularly, the present invention relates to a transceiver for providing an interface between twisted pair lines and an intelligent cell.

BACKGROUND OF THE INVENTION

There are a number of commercially available products which provide sensing, control, and communications in a network environment. These products range from elaborate systems having a large amount of intelligence to simple systems having little intelligence. By way of example, such a system may provide control between a light switch and a light. When the light switch is operated, a digital code pattern is transmitted by one cell over power lines or free space and is received by another cell at the light. When the code is received, it is interpreted and subsequently used to control the light. Such a system, comprising a network of intelligent cells in which the cells communicate, control and sense information, is described in U.S. patent entitled, "Network and Intelligent Cell for Providing Sensing, Bidirectional Communications and Control", U.S. Pat. No. 4,969,147, issued Nov. 6, 1990, which application is assigned to the assignee of the present invention.

The transmitting and receiving of digital data can be performed by a series of transceivers, each of which is connected to an individual cell of a network. These transceivers may communicate with one another in numerous different ways over various media and at many different baud rates. They may, for example, transmit and receive radio frequency (RF) or microwave frequency signals through antennas. The transceivers could be connected to standard communications lines, such as twisted pair lines, fiber optic cables, and coaxial cables. Alternatively, infrared or ultrasonic implementations can be utilized to effectuate the transmission of data between the transceivers. Indeed, even power lines have been employed as a transmission medium by implementing spread spectrum techniques.

Selecting a medium involves a trade-off between cost and performance. Although fiber optic and coaxial cables meet stringent transmission criteria, these media are relatively expensive. Moreover, significant costs are incurred in order to physically route these cables between each of the transceivers.

It is often more cost effective to take advantage of an already existing medium, such as 120 volt AC power distribution lines, over the airwaves as RF, or twisted pair lines found in telephone communications. However, both power lines and RF transmissions are highly susceptible to noise and/or other electrical interferences. Hence, digital signals often suffer great degradation. Twisted pair lines, which are normally used to conduct analog voice signals for telephone systems can, instead, be utilized in conducting digital signals. Although twisted pair lines generally exhibit better transmission characteristics, they are nonetheless susceptible to signal distortions and attenuation. The distortions and attenuation tend to increase over longer distances and higher data rates. The distortion and attenuation problems are attributable in part to the transmission of digital data as a series of square waves. The edges of the square waves involve fast transitions in voltage. In turn, these fast transitions contain high frequency harmonics, which result in reflections, ringing, etc. Ideally, the transmitted waveform should resemble a sine wave having one fundamental frequency. Thereby, the single frequency minimizes the harmonics being propagated through the twisted pair lines and the attendant reflections, ringing, etc.

Converting the square wave to a sinusoidal waveform is a rather complicated task. It can be approximated by implementing a complex analog filter. The complexity is magnified in order to accommodate different data rates. A programmable filter design implementation is a costly and complex solution. The transmitted sinusoidal waveform often is degraded by noise and media degradation, and the receiver is needed to recover the original sinusoidal waveform in the presence of this noise.

Thus, there is a need in the prior art for transceivers to minimize the harmonic content of digital data being sent over twisted pair lines in an effort to reduce distortions caused by reflections, ringing, etc. It would be highly preferable for such a transceiver to be simple, efficient, and cost-effective.

SUMMARY AND OBJECTS OF THE INVENTION

The transceiver of the present invention is used in transmitting and receiving digital data over twisted pair lines interconnecting a number of nodes in a network. In the transmission process, the digital data is converted into stair-stepped sinusoidal waveforms. The conversion process utilizes a number of current sources which supply various amounts of current. A set of switches is used to direct the amount and the direction of the current supplied by the current sources flowing through a resistor connected across the twisted pair lines. The current flowing through the resistor produces the output voltage on the twisted pair lines. Shift registers control the operation of the switches so as to produce the stair-stepped waveforms. The digital data to be sent is clocked into the shift registers, which cause the stair-stepped sinusoidal waveforms to be sent in accordance with the digital data. By varying the clock rate of the shift registers, the data rate is correspondingly changed.

When receiving data, the receiver re-converts received stair-stepped sinusoidal waveforms back into square waves. This is accomplished by implementing a hysteresis comparator which compares incoming signals against a pre-determined threshold. Only those signals having an amplitude exceeding the threshold are deemed valid. In addition, a zero-crossing detector detects when a received differential signal crosses zero volts. This corresponds to the edges of a square wave. The combined functions of these two comparators produces square waves from the received stair-stepped sinusoidal waveforms. The phase lock loop enhances the recovery of data in the presence of noise and jitter.

In addition, the received signals are filtered prior to being processed by the two comparators. The filter is comprised of an RC network of lowpass filters programmable for different data rates. A switch is coupled between the resistors and the capacitors in order to select the proper frequency response corresponding to the data rate. The output signal is taken from the node between the switch and the capacitor. Thereby, the resistor value can be made slightly smaller in order to accommodate the resistance inherent in the switch.

Other aspects of the present invention will be apparent from the following description.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1 shows a network which includes a plurality of nodes.

FIG. 2 shows a typical node as comprising a transceiver module which interfaces between a twisted pair line and a cell.

DETAILED DESCRIPTION

Figure 3:
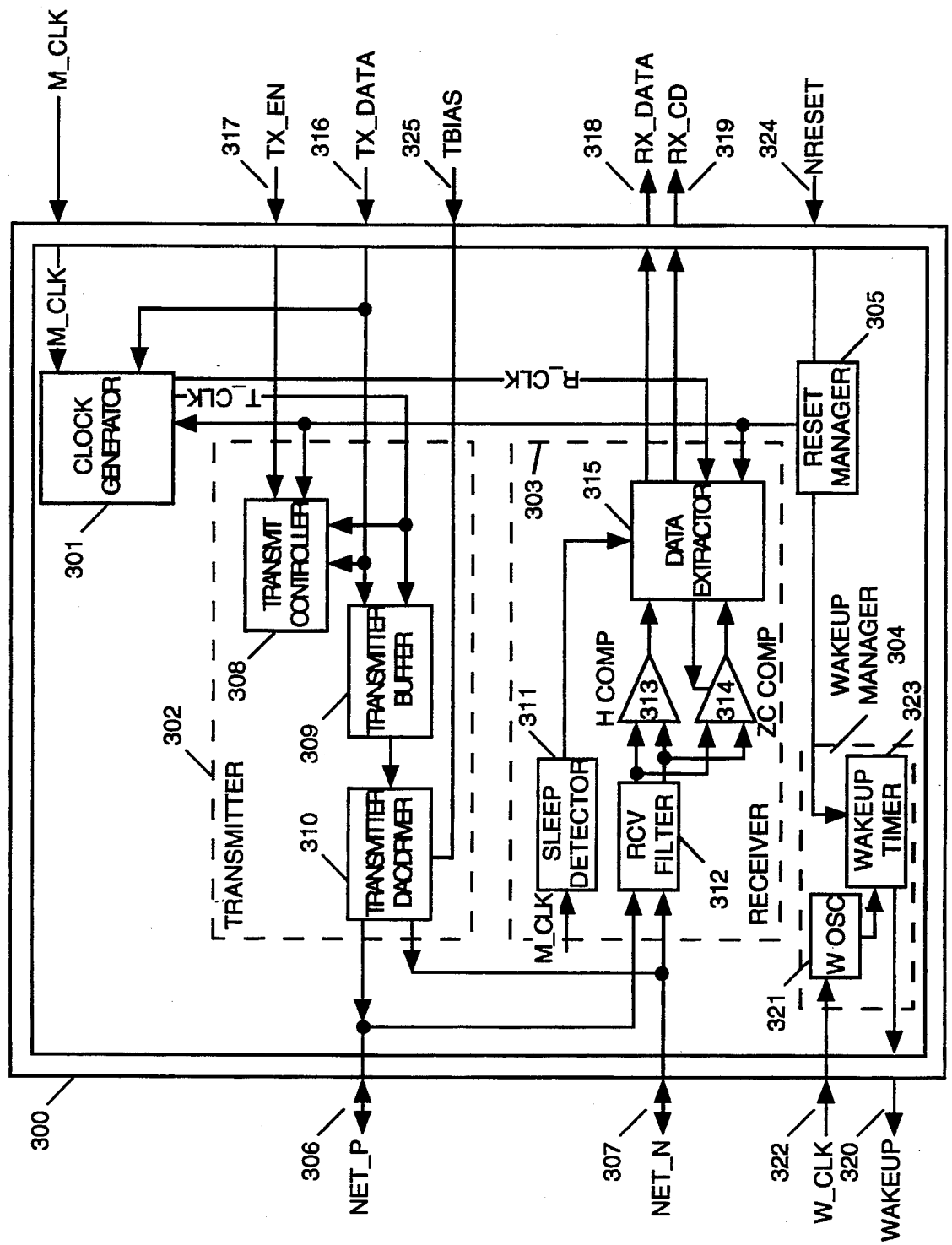
FIG. 3 shows a more detailed block diagram of the transceiver.

A transceiver for use in a network having distributed intelligence is described. In the following description, numerous specific details are set forth, such as specific voltage levels, waveforms, etc., in order to provide a thorough understanding of the present invention. It will be apparent to one skilled in the art that the present invention may be practiced without use of these details. In other instances, well-known circuits and methods are not set forth in detail in order not to unnecessarily obscure the present invention.

Referring now to FIG. 1, a network is illustrated which includes a plurality of nodes, such as nodes 16, 17, 18, 20, and 21 interconnected by twisted pair lines. The lines as illustrated, form numerous branches such as branches 11, 12, 13, 14 and 15. The transceiver modules of the present invention permit the branches to be placed virtually anywhere. The topology of the network is not constrained. Branches may be simply added where needed. Termination is not required, for instance, end 19 is not terminated. Moreover, as will be seen, this two wire interconnection between nodes is polarity insensitive. This free topology such as rings, stars, multiple branches and others is in sharp contrast to the normal twisted pair topology that requires an ideal transmission line.

In the currently preferred embodiment, all the nodes receive power over the twisted pair lines from a central power supply 10. The power supply 10 also includes circuitry for providing damping of transients in the network. In the currently preferred embodiment, a DC potential of 42 volts (or lower) is used and is applied to the twisted pair line 11 for distribution to all the nodes of the network.

The network of FIG. 1 operates generally as described in U.S. Pat. No. 4,918,698. For example, a light switch may be associated with node 17 and when the position of the switch is changed, it is sensed and an appropriate data packet or packets is transmitted via the branches to node 16 which may control a light.

A typical node of FIG. 1 is shown in FIG. 2 as comprising a transceiver module shown within dotted lines 40 which interfaces between a twisted pair line 23 and a cell 27. Through lines 21, the cell may control and/or sense as described in U.S. Pat. No. 4,918,690. In the currently preferred embodiment, the transceiver module 40 comprises a node coupler 24, power supply 26 and a signal transceiver 25. The coupler 24 permits the high frequency communications packets to be coupled from the line 23 to the transceiver 25 while allowing the DC power from the lines 23 to be coupled to the power supply 26. Transceiver 25 detects the incoming data and communicates it to the cell. The transceiver also receives outgoing data from the cell 27, develops the appropriate waveforms for transmission in the network and then couples the outgoing data through the coupler onto lines 23. In the currently preferred embodiment, a carrier sense multiple access with collision detection (CSMA/CD) network access method for managing collisions of data packets is utilized. Power supply 26 receives the 42 volts (or other voltage) from the lines 23 and provides +5 volts for powering the coupler 24, transceiver 25 and cell 27.

FIG. 3 shows a more detailed block diagram of the transceiver. In the currently preferred embodiment, the transceiver is implemented as a single semiconductor chip. The transceiver chip 300 includes the following six basic functional blocks: clock generator 301, wave-shapped transmitter 302, receiver 303, wakeup manager 304, and reset manager 305. Clock generator 301 generates the master clock for transceiver chip 300.

Transmitter 302 is used to transmit differential Manchester encoded data as NET_P and NET_N signals onto the twisted pair lines 306 and 307. The digital data to be transmitted is sent by the intelligent cell over the TX_DATA signal on line 316 to the transmitter 302. Transmission is enabled by the intelligent cell through the TX_EN signal on line 317. The TBIAS signal on line 325 sets the output current level. Transmitter 302 is comprised of the transmitter controller 308, transmitter buffer 309, and the digital-to-analog converter (DAC)/driver 310. The Transmitter Buffer samples the digital square wave at 16-times the data rate and presents the last 8 samples to the DAC/driver to be converted to a stair-step. The Transmitter Controller directs the DAC/driver to access the twisted-pair network when a packet is to be transmitted; it also appends an anti-code violation and active quench to the end of a packet. The DAC/driver 310 converts the digital square waves into stair-stepped sinusoidal representations of the square waves for transmission differentially over the twisted pair lines 306–307. In the currently preferred embodiment, sixteen steps or eight levels are implemented to simulate an approximate single cycle of sinusoidal waveform. Consequently, the amplitude of each step is smaller than that of the square wave, which means that there is less energy content per step. Furthermore, the stair-stepped waveform is at an inherently higher frequency because there are more edges in the stair-stepped waveform compared to the square waves. The result is that the energy is more uniformly distributed across the entire frequency spectrum.

The receiver 303 is comprised of a sleep detector 311, filter 312, hysteresis comparator 313, zero crossing detector 314, and data extractor 315. Sleep detector 311 bypasses the phase lock loop in the absence of a master clock. In other words, sleep detector 311 detects the presence of master clock and generates a signal to power up the sections of the transceiver which were temporarily turned off in order to conserve power. The same twisted pair lines 306 and 307 used in the transmission of data are also coupled to receiver 303. Packets of data sent by other nodes are received by transceiver 301 via the twisted pair lines 306 and 307. A low-pass filter 312 is used to filter out the high frequency noise. The output signal from filter 312 is coupled to hysteresis comparator 313 and zero crossing detector 314. Hysteresis comparator 313 is used to distinguish valid received signals over noise. This is accomplished by comparing the received signal against a pre-determined threshold. Only those signals exceeding the threshold become qualified. The zero crossing detector determines those instances when the differential received signal changes polarity. The output from the comparators 313 and 314 are used by data extractor 315 to generate the processed received data signal RX_DATA, which is sent to the intelligent cell on line 318. Data extractor 315 also outputs a RX_CD signal on line 319, which signifies the detection of valid data.

Wakeup manager 304 provides a power conservation feature. During the times when data is not being transmitted, the transceiver can be powered down to minimize power consumption. This feature is useful for those applications wherein data is being transmitted periodically (e.g., reporting the status of a security alarm system once every second). The wakeup manager 304 sends a WAKEUP pulse on line 320 at a predetermined rate corresponding to the transmission requirements (e.g., once per second for the alarm system). The WAKEUP pulse is generated by an oscillator 32 1 clocked at a frequency specified by the value of a capacitor on W_CLK on line 322. Oscillator 321 provides the timing for triggering wakeup timer 323, which generates the WAKEUP pulse.

The reset manager 305 accepts a NRESET signal on line 324 from the intelligent cell and resets the clock generator 301, transmitter 302, receiver 303, and wakeup manager 304.

Figure 4:
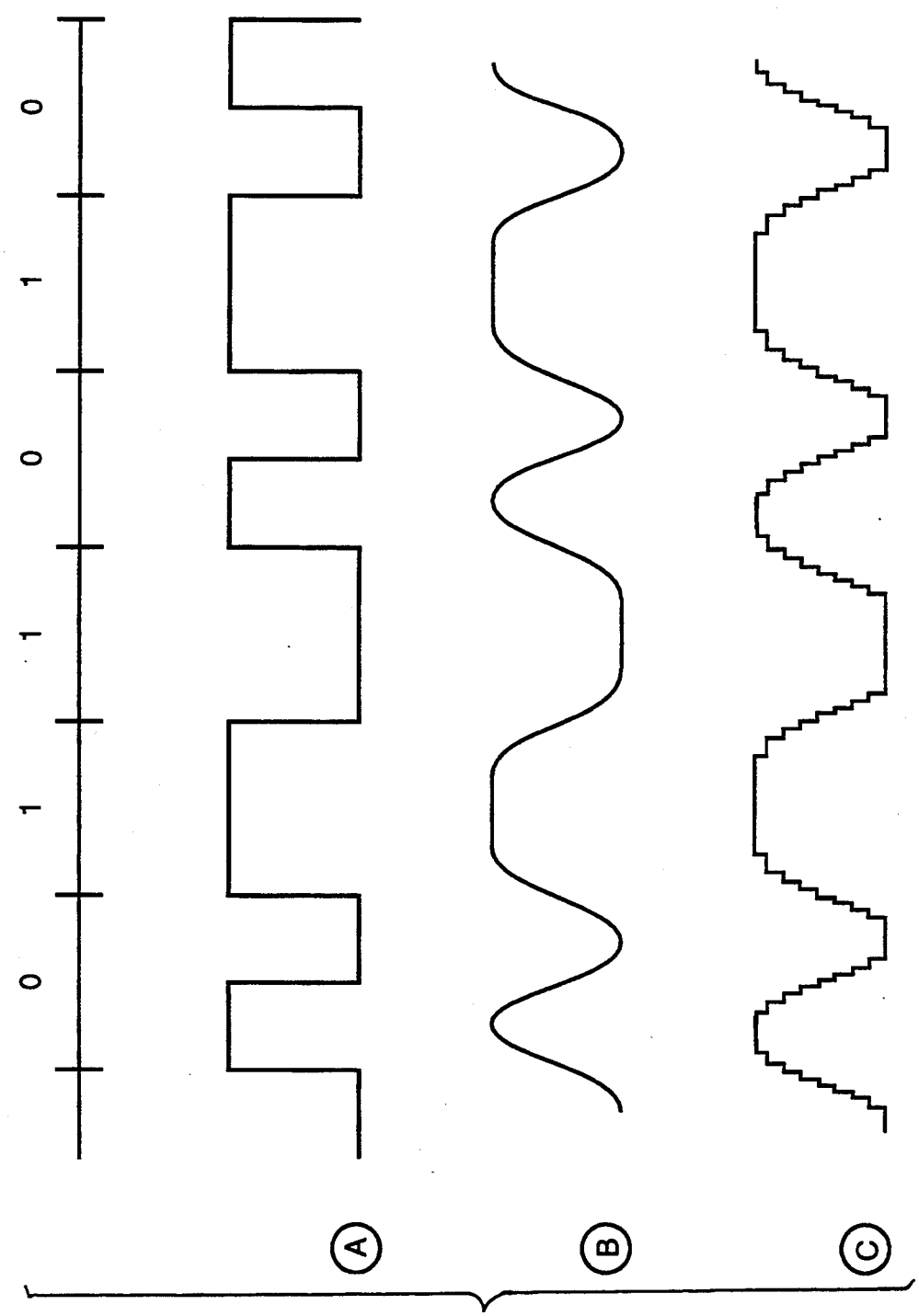
FIG. 4 shows some sample waveforms conveying a digital signal.

The transmit waveform and the output driver of the transmitter is described in detail below. FIG. 4 shows some sample waveforms conveying a digital signal. In the currently preferred embodiment, digital Manchester encoding is utilized. In Manchester encoding, a transition occurs at every timing boundary. A transition at the mid-point of a timing period indicates a "0", whereas the lack of a transition indicates a "1". As an example, signal A of FIG. 4 shows a Manchester encoded digital signal representing the binary string "011010". Waveform B is a sinusoidal representation of the square wave of signal A. Note that a phase delay is introduced when converting from the square wave to the sinusoidal. In the currently preferred embodiment, the present invention does not transmit either a square wave nor a true sine wave. Rather, a stair-stepped representation of a sinusoid, shown as signal C, is transmitted over the twisted pair lines.

Figure 5A:
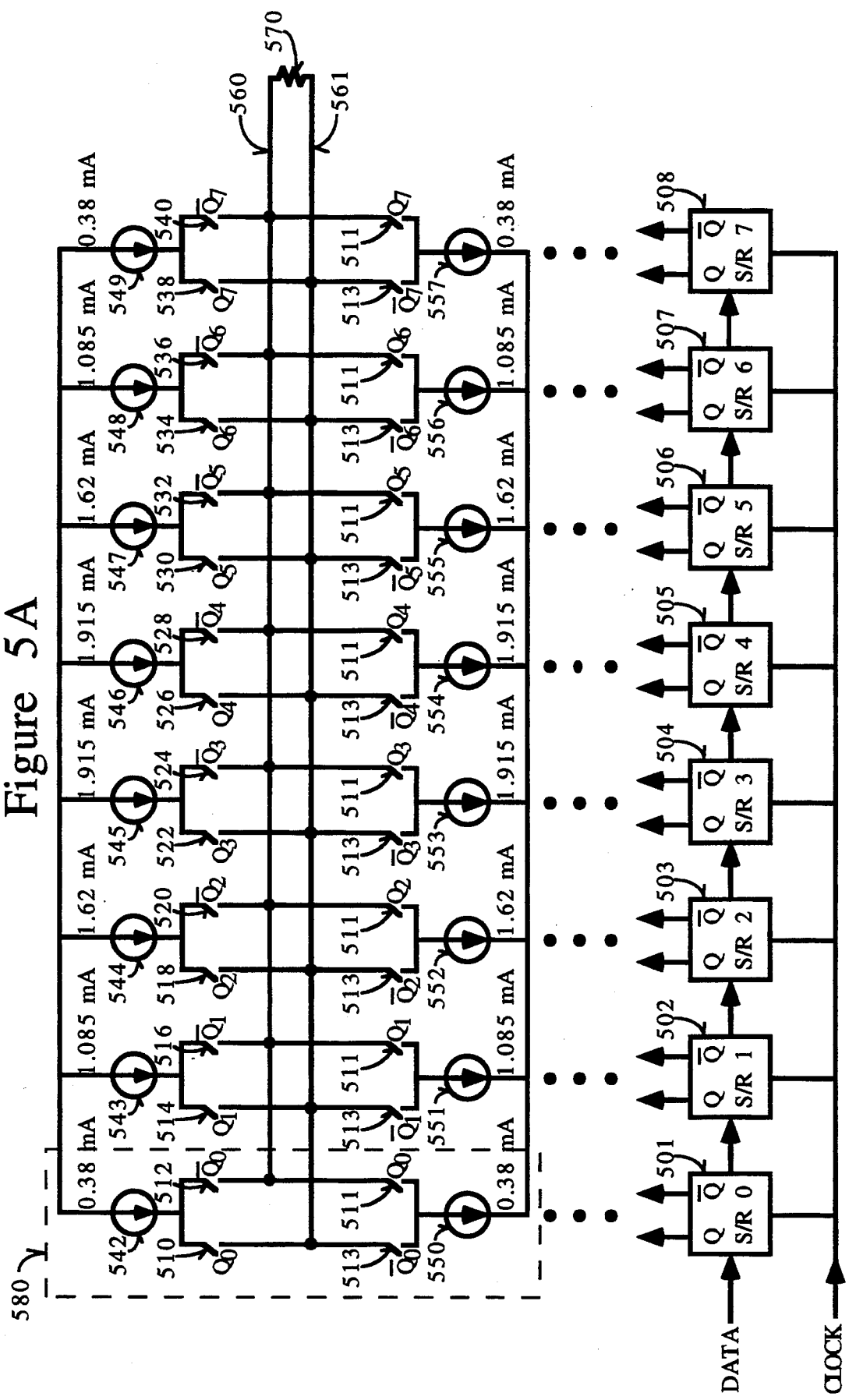
FIG. 5A is a circuit diagram illustrating the output driver stage of the transmitter for generating the stair-stepped, sinusoidal transmit waveforms.
Figure 5C:
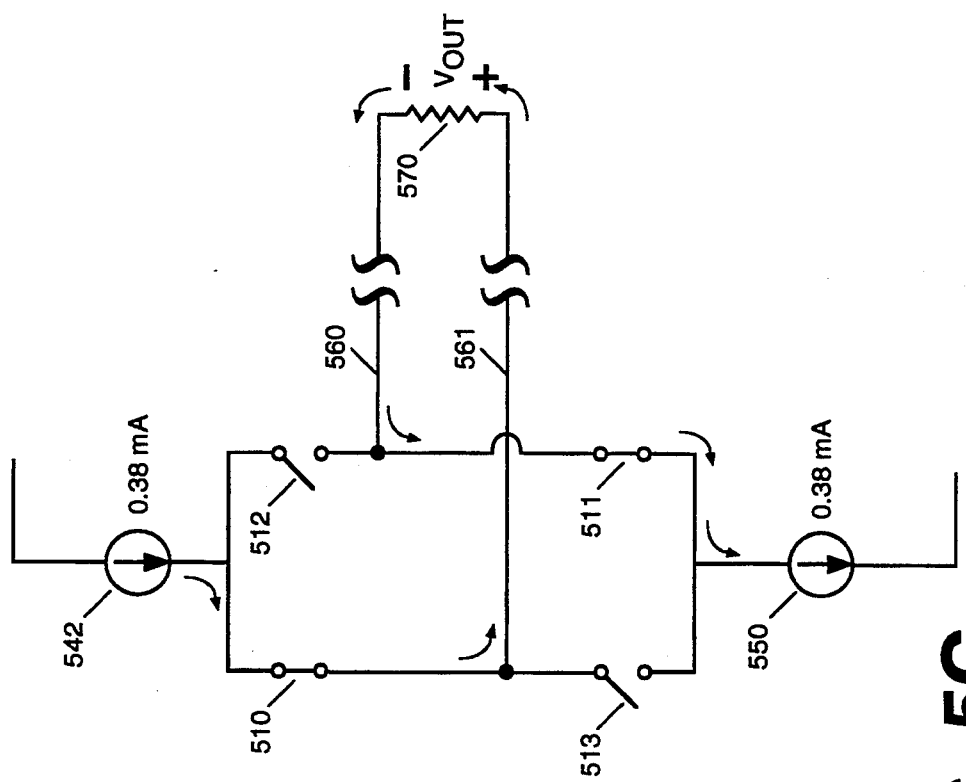
FIG. 5C illustrates the current flow when a "1" is clocked into the S/R shift register.
Figure 5B:
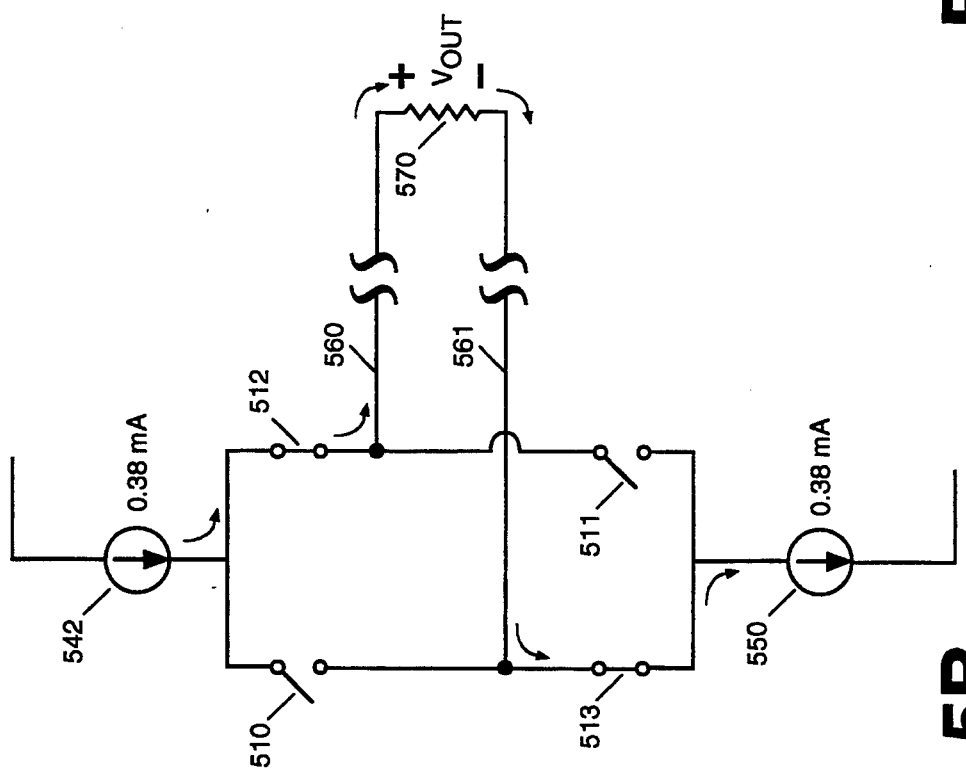
FIG. 5B illustrates the current flow when a "0" is clocked into the S/R 0 shift register.

FIG. 5A is a circuit diagram illustrating the output driver stage of the transmitter for generating the stair-stepped, sinusoidal transmit waveforms. The digital data to be transmitted is successively clocked through the eight S/R shift registers 501-508. The Q and $\overline{Q}$ outputs from the S/R shift registers 501-508 are used to control the thirty-two switches 510-541 associated with the sixteen current sources 542-556. In the currently preferred embodiment, the current sources 542-549 are weighted to equal a combined 10 milliamps. Likewise, current drivers 550-557 supply equivalent currents, which also add up to 10 milliamps. Switches 510-541 are electronic switches such as CMOS transistors, pass-gates, or their equivalents. Instead of turning the current sources on/off, the current sources are continuously left on. The switches are used to route the currents from the current sources into either line 560 or line 561 depending on state of switches. This results in an improved transient response. An output of "1" from a shift register, closes a switch, while an output of "0" opens a switch. Note that $\overline{Q}$ is the inverse of Q. Each S/R shift register controls a set of four switches. In particular, each of the S/R shift registers 501-508 respectively controls switches 510-513, 514-517, 518-521, 522-525, 526-529, 530-533, 534-537, and 538-541. More specifically, the Q output of shift register 501 controls switches 510-511 while the $\overline{Q}$ output of shift register 501 controls switches 512-513; the Q output of shift register 502 controls switches 514-515, while its $\overline{Q}$ output controls switches 516-517; the Q output of shift register 503 controls switches 518-519, while its $\overline{Q}$ controls switches 520-521; etc. By controlling switches 510-541, differing amounts of current can be sent through resistor 570. In the currently preferred embodiment, resistor 570 comprises a 50 ohm resistor. Supplying different amounts of current through resistor 570 produces different voltages across resistor 570 in the range of $\pm 0.5$ volts. Thereby, different output voltages are achieved.

For example, shift register 501 controls switches 510, 511, 512, and 513. Supposing that the input to shift register 501 is a "0", this means that the Q output is 0, and the $\overline{Q}$ output is a "1". Since the Q output of shift register 501 is a "0", switches 510 and 511 are open. Given that $\overline{Q}$ is a "1", switches 512 and 513 are closed. FIG. 15B illustrates the current flow when a "0" is clocked into the S/R 0 shift register. For the sake of clarity, the operation of one stage of the DAC output driver comprising S/R 0 shift register 501, current drivers 542 and 550, and switches 510-513 is now described in detail. The 0.38 mA of current from current source 542 is conducted by line 560 through resistor 570, to current source 550 via line 561, as indicated by the arrows. Hence, a positive output voltage equal to 0.38 mA times 150 ohms = +19 mV is produced across resistor 570.

FIG. 15C illustrates the current flow when a "1" is clocked into the S/R shift register 501. The 0.38 mA current from current source 542 is conducted through resistor 570 on line 561 and to current source 550 on line 560. Note that the current through resistor 570 is flowing in an opposite direction compared to the situation wherein the shift register was set to a "0". Hence, a negative output voltage of −19 mV is produced across resistor 570.

Figure 5D:
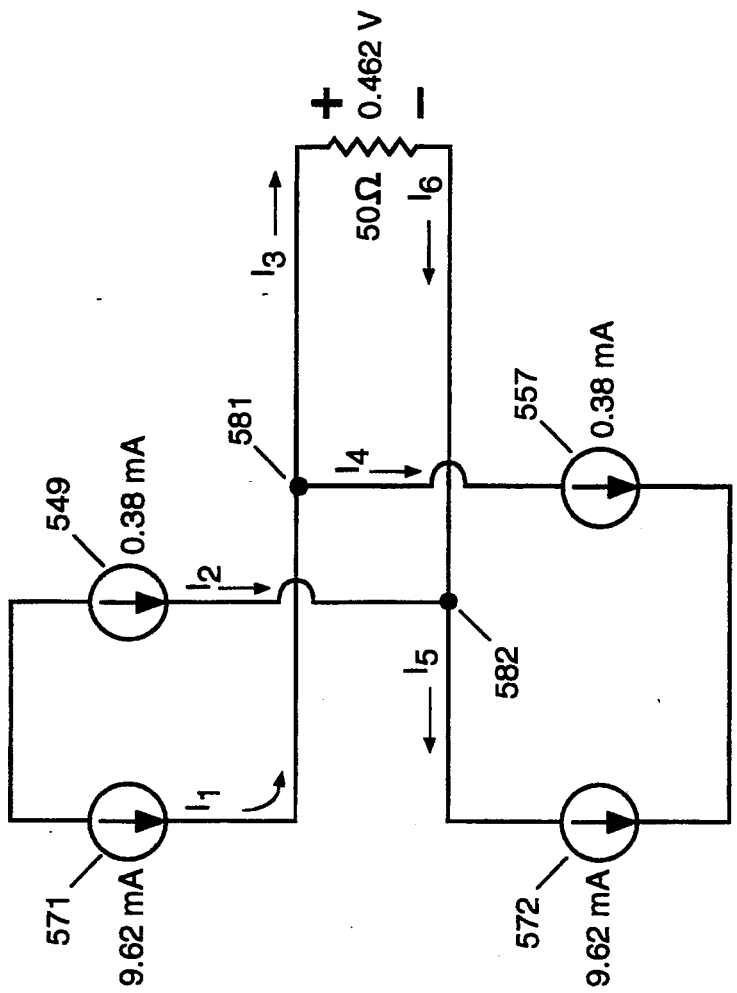
FIG. 5D illustrates the current flows when a "00000001" is clocked into the S/R shift registers.

FIG. 5D illustrates the current flows when a "00000001" is clocked into the S/R shift registers 501–508. Since "0s" are input to shift registers 501–507, this causes current sources 542–548 and 550–556 to flow in the same manner. The current source 571 supplying 9.62 mA represent the combined currents of current sources 542–548. Similarly, current source 572 represents the combined currents from current sources 550–556. The current flows are analyzed according to Kirchoff's current law, which states that the algebraic sum of all the currents entering any node is zero. Applied to node 581, the currents entering that node, $I_1$, equals the current exiting that node, $I_2$ and $I_3$. Hence, $I_3$ equals $I_1 - I_2 = 9.62$ mA $- 0.38$ mA $= 9.24$ mA. At node 582, $I_4 = I_5 + I_6$. Hence, $I_6$ equals $I_4 - I_5 = 0.38$ mA $- 9.62$ mA $= -9.24$ mA. The voltage across resistor 570 is $(9.24$ mA$)(50\Omega) = +0.462$ volts for this state.

In the currently preferred embodiment, the shift registers are clocked at sixteen times the data rate. Consequently, eight clock cycles (i.e., eight steps) after clocking a transition into the first shift register, that transition is being clocked out. This transition generates a half cycle of the sinusoidal. Thereby, different data rates are readily handled by adapting the clock rate of the shift registers in accordance with the new data rate. In summary, different output voltages are produced by directing the flow of the various currents through resistor 570 as determined by the states of the switches. In turn, the switches are controlled by the S/R shift registers. The output voltages are chosen to produce eight steps representative of one half of a sine wave. This is accomplished by determining the net current corresponding to the sine wave at $\pm 0°$, $\pm 22.5°$, $\pm 45°$, $\pm 67.5°$, and $\pm 90°$. Starting with a maximum output net output current of 10 mA, the currents are given as $\pm 10$ mA sin $22.5° = \pm 3.83$ mA, $\pm 10$ mA sin $45° = \pm 7.07$ mA, $\pm 10$ mA sin $67.5° = +9.24$ mA, and $\pm 10$ mA sin $90° = +10$ mA. Table i below lists the output voltage as a function of the input data to the S/R shift registers.

| S/R0 | S/R1 | S/R2 | S/R3 | S/R4 | S/R5 | S/R6 | S/R7 | Net $I_{out}$ (mA) | Net $V_{out}$ (mV) |
|---|---|---|---|---|---|---|---|---|---|
| 0 | 0 | 0 | 0 | 0 | 0 | 0 | 0 | 10 | 500 |
| 1 | 0 | 0 | 0 | 0 | 0 | 0 | 0 | 9.24 | 462 |
| 1 | 1 | 0 | 0 | 0 | 0 | 0 | 0 | 7.07 | 353.5 |
| 1 | 1 | 1 | 0 | 0 | 0 | 0 | 0 | 3.83 | 191.5 |
| 1 | 1 | 1 | 1 | 0 | 0 | 0 | 0 | 0.0 | 0 |
| 1 | 1 | 1 | 1 | 1 | 0 | 0 | 0 | $-3.83$ | $-191.5$ |
| 1 | 1 | 1 | 1 | 1 | 1 | 0 | 0 | $-7.07$ | $-353.5$ |
| 1 | 1 | 1 | 1 | 1 | 1 | 1 | 0 | $-9.24$ | $-462$ |
| 1 | 1 | 1 | 1 | 1 | 1 | 1 | 1 | $-10$ | $-500$ |

Figure 5E:
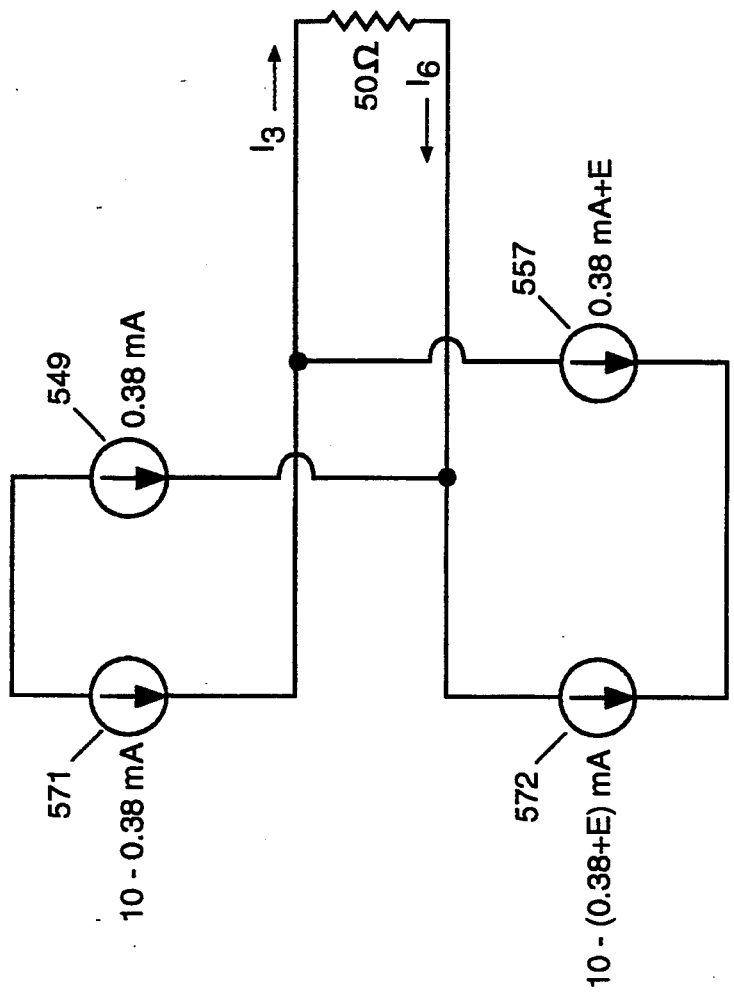
FIG. 5E illustrates the current flow wherein there is an error in current source.

It should be noted that in the present invention, an error in one of the current sources has minimal impact on the output voltage due to error cancellation. FIG. 5E illustrates the current flow wherein there is an error (E) in current source 557. Given an input signal of "00000001" to the shift registers, current source 571 sources $10 - 0.38 = 9.24$ mA, whereas current source 572 sinks $10 - (0.38 + E)$mA. Hence, $I_3 = 10 - 0.38 - (0.38 + E) = 9.24 - E$ and $I_6 = 0.38 - [10 - (0.38 + E)] = -9.24 + E$. Clearly, the common-mode error cancels out (i.e., $-E + E = 0$).

Ideally, the current sourced to the termination resistor 570 should be equal to the amount of current sinked from that resistor. However, imbalances between the current sources 542–549 and 550–557 might occur. Over a period of time, the excess current will integrate, resulting in an offset. Although this impact is negligible with respect to the differential signal on the twisted pair lines 560 and 561, the common-mode voltage will eventually rail out and saturate at the supply voltage. In the currently preferred embodiment, this common-mode drift problem is handled by detecting the common-mode offset, feeding back a signal corresponding to the offset in order to adjust the total amount of current such that the total amount of current being sourced mirrors the amount of current being sinked resulting in no common mode offset.

Figure 5F:
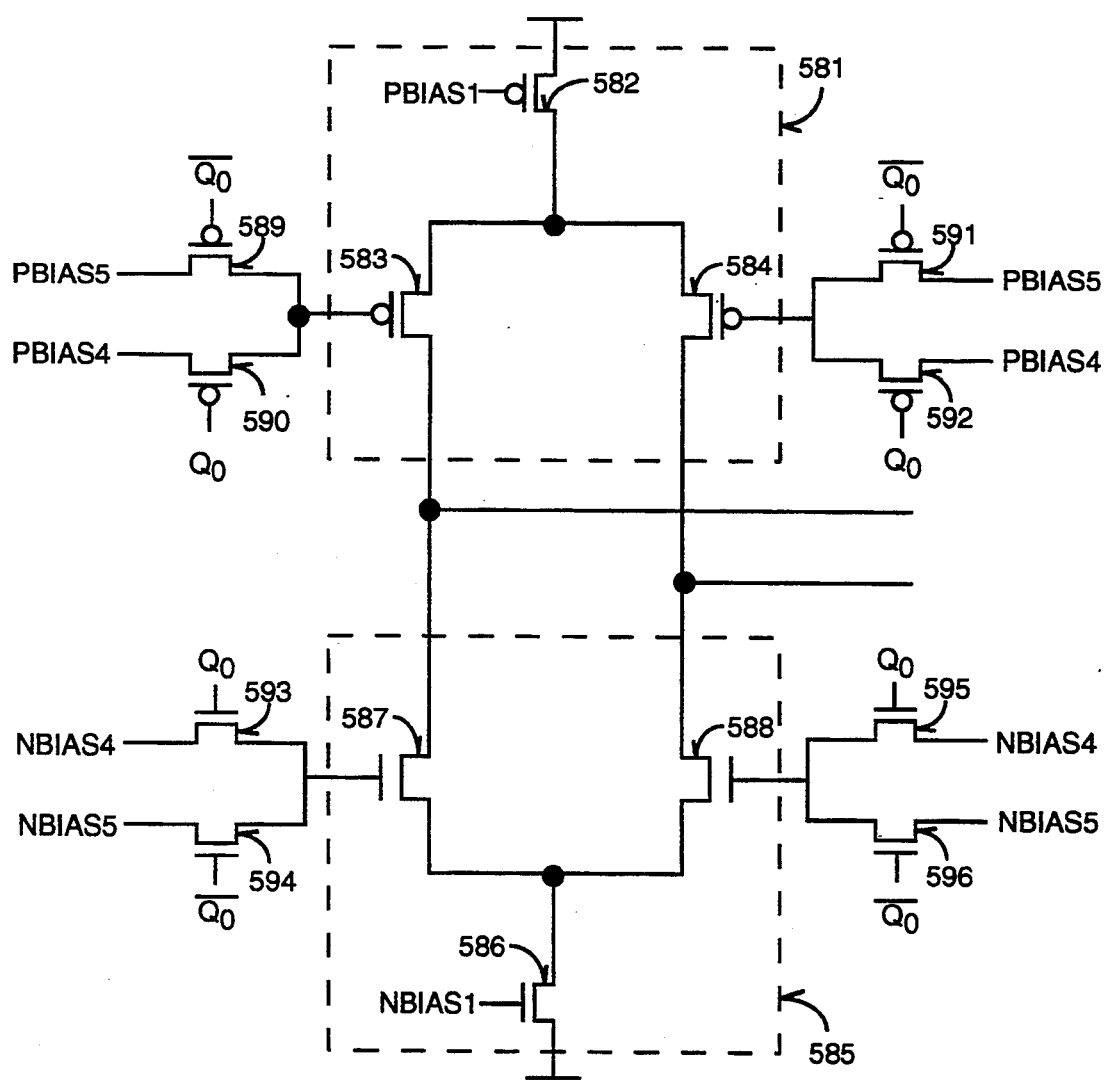
FIG. 5F shows one embodiment of a pair of current sources and associated switches.

FIG. 5F shows a transistor level circuit diagram of one possible embodiment for implementing a pair of current sources and the four associated switches as shown in block 580 of FIG. 5A. The current source 542 of FIG. 5A is implemented by a cascode transistor arrangement 581 which is comprised of the p-channel transistors 582–584. The current source 550 of FIG. 5A is also implemented by a cascode transistor configuration 585 which is comprised of the n-channel transistors 586–588. In this embodiment, the same transistors used as part of the cascode configuration are also used to perform the switching functions. In other words, transistors 583, 584, 587, and 588 are also used as switches. Transistors 589 and 590 are used to control transistor 583; transistors 591 and 592 control transistor 584; transistors 593 and 594 control transistor 587; and transistors 595 and 596 control transistor 588 according to the $Q_0$ and $\overline{Q_0}$ signals. Hence, this design minimizes the gate-to-source and gate-to-drain switch coupling because the biasing voltages at the gates of transistors 583, 584, 587, and 588 are required to swing by only a few hundred millivolts as opposed to the whole power supply.

Figure 6:
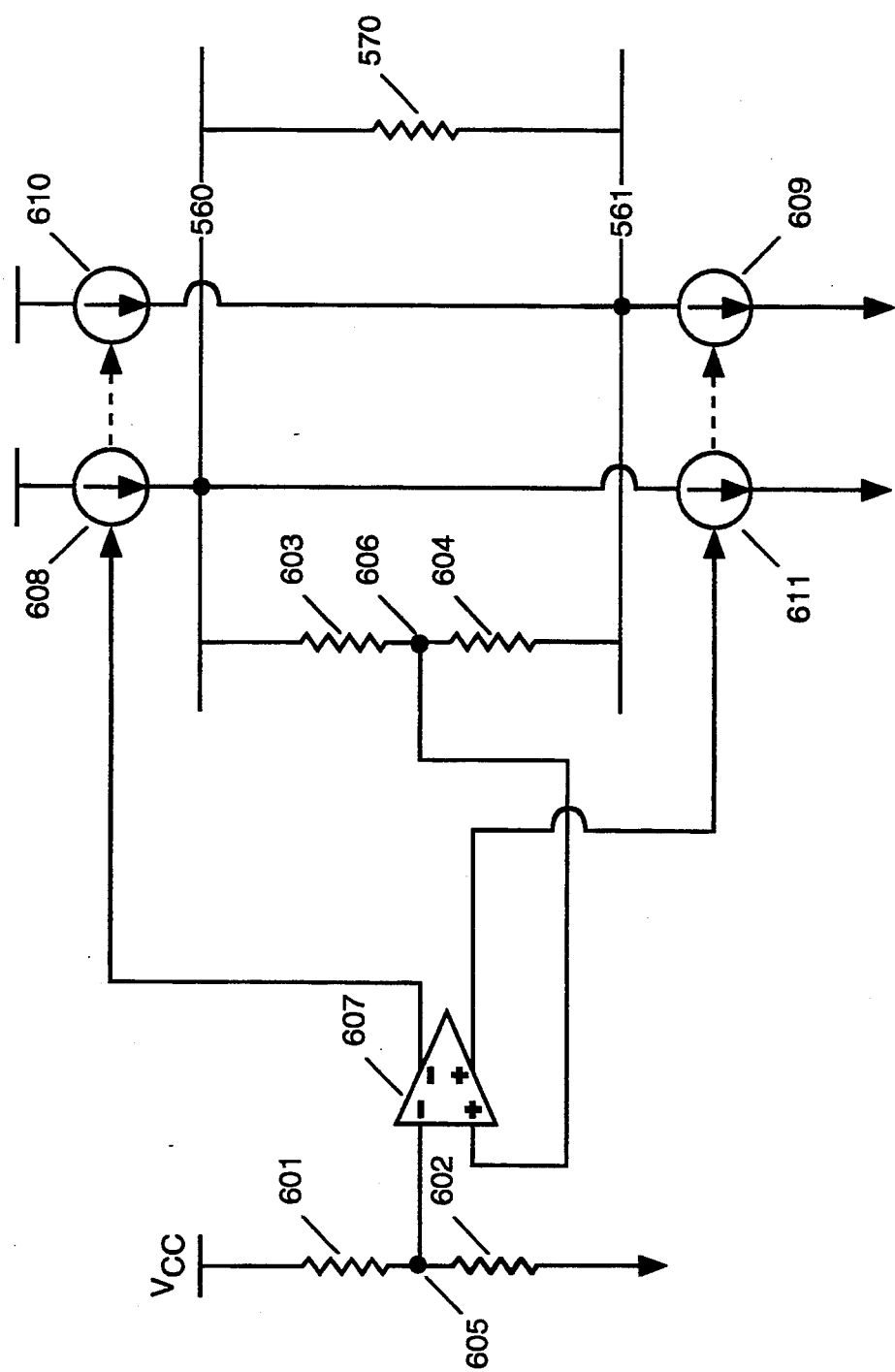
FIG. 6 illustrates a common-mode compensation circuit, which is coupled to the DAC/driver.
Figure 7:
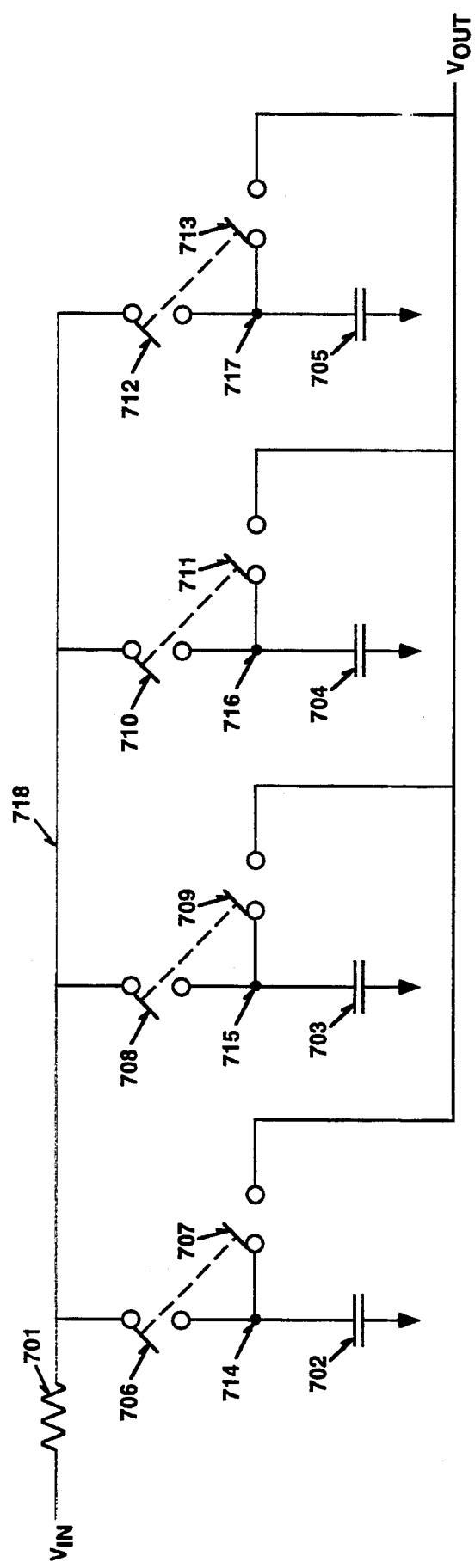
FIG. 7 shows a circuit diagram of the lowpass filter of the receiver.

FIG. 6 illustrates a common-mode compensation circuit, which is coupled to the DAC/driver. Two resistors 601 and 602, having the same resistances, are coupled in series between $V_{cc}$ and ground. Another two resistors 603 and 604, are coupled in series across the twisted pair lines 560 and 561. The voltage at node 605, between resistors 601 and 602, is used as a reference voltage. The voltage at node 606 is the average common mode voltage of the output signal across lines 560 and 561. The average common-mode of the output signal at node 606 is fed back as an input to differential amplifier 607. The reference voltage is also input to differential amplifier 607, which compares it against the average common-mode output signal. If the output signal is greater than the reference voltage, current sources 611 and 609 sink current which then pulls nodes 560 and 561 more negative. This pulls the average common-mode voltage on node 606 more negative. Conversely, if output signal is less than the reference voltage, current sources 608 and 610 source current which then pulls nodes 560 and 561 more positive, thus pulling the average common mode voltage on node 606 more positive. Thus, node 606 is pulled up/down by implementing four additional current sources 608–611. These additional current sources are controlled by the output from difference amplifier 607. Hence, current sources 608–611 either sources or sinks sufficient current so as to maintain the common-mode output voltage at the reference voltage on node 605 in its quiescent state. Referring now to FIG. 7, a circuit diagram of the low-pass filter of the receiver is shown. In the currently preferred embodiment, four different data rates (i.e., 78.125 kHz, 39.062 kHz, 19.031 kHz and 9.766 kHz) are possible. Hence, a lowpass filter having four different critical frequencies are implemented. This is accomplished by an RC network having four different capacitances, wherein the capacitance corresponding to a particular data rate is selected to provide the desired frequency response. The R value is given by resistor 701. The C values are given by the four capacitances 702–705. The capacitances can be implemented as a MOS device, capacitor, or other equivalents. In the currently preferred embodiment, resistor 701 and four capacitances 702–705 are implemented. The four pairs of switches 706–707, 708–709, 710–711, and 712–713 control which of the capacitances 702–705 are switched in or are active, thereby controlling the frequency response of the lowpass filter. Each pair of switches are either both in the closed position or both in the open position. The switches are comprised of CMOS transistors.

It should be particularly pointed out that the output signal is taken from nodes 714–717, rather than at node 718. The significance is that the switches have intrinsic resistance. If the output signal were taken from node 718, the resistance intrinsic to the switches produces an unwanted zero in the frequency response, thereby degrading the lowpass filtering characteristics. By taking the output signal after switches 706, 708, 710, and 712, the resistances attributable to these switches are placed in series with that of resistor 701. Consequently, the resistance of resistor 701 can be made such that it produces negligible error when summed with the resistance of the switches. Since the input impedance of the stage following the filter is extremely large, the resistances of switches 707, 709, 711, and 713 have negligible effect.

Figure 8:
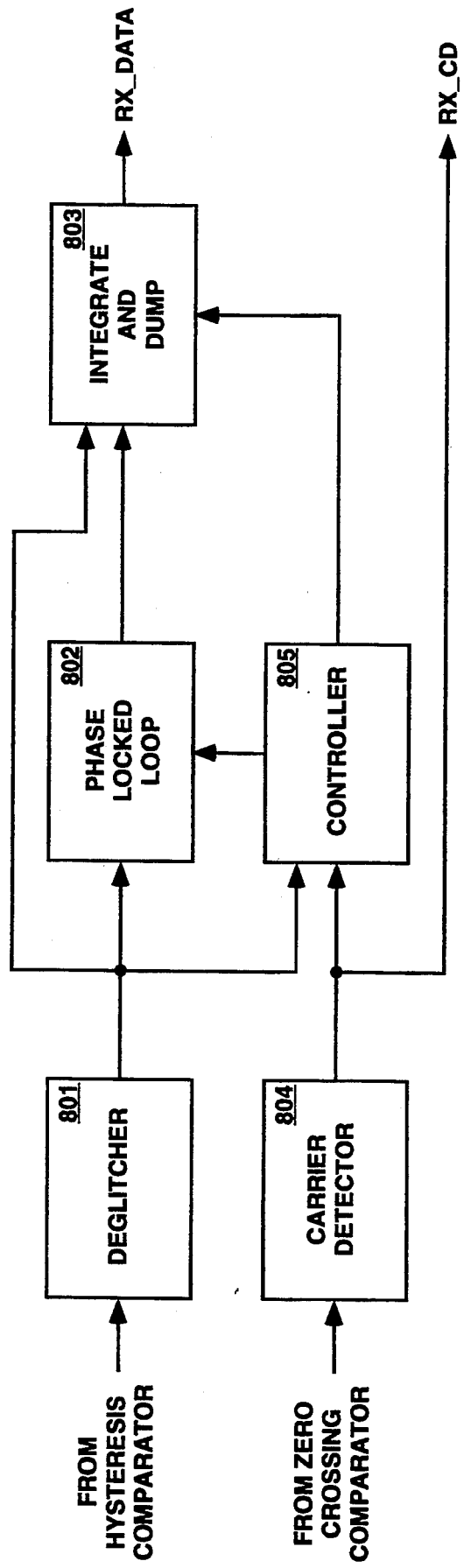
FIG. 8 shows a block diagram of the data extractor of the receiver.

Referring now to FIG. 8, a block diagram of the data extractor of the receiver is shown. The high frequency noise and spikes from the output of the hysteresis comparator are filtered out by deglitcher 801. The resulting square-wave is synchronized to the internal frequency of the expected received data rate by phase locked loop 802. Optimally, the output from phase locked loop 802 is a digital bit stream that is coincident with the clock edges. The output waveform from the phase locked loop is processed by integrate and dump block 803, which essentially performs the function of a matched filter for square waves. The output signal from the zero crossing comparator is processed by carrier detector block 804, which generates a carrier detect signal RX_CD. Controller 805 uses the carrier detect signal to generate logic signals used to control the operation of the phase locked loop 802 and the integrate and dump 803 blocks.

Thus, a transceiver for transmitting and receiving stair-stepped sinusoidal waveforms on twisted pair lines is disclosed.

What is claimed is:

1. A transceiver for transmitting and receiving digital signals between a plurality of nodes in a network interconnected by twisted pair lines, the transceiver comprising:
   a converting means for converting the digital signals to be transmitted to stair-stepped sinusoidal waveforms representative of the digital signals, said converting means comprising:
   a plurality of current sources for supplying different amounts of current;
   a plurality of switching means for routing the currents supplied by the current sources to the twisted pair lines;
   a means for terminating the twisted pair lines, wherein a voltage across the twisted pair lines is proportional to the different amounts of current conducted through the twisted pair lines; and,
   a means for controlling the plurality of switching means, wherein the voltage across the twisted pair lines appoximates the stair-stepped sinusoidal waveform;
   a means for transmitting the stair-stepped sinusoidal waveforms on the twisted hair lines;
   a means for receiving stair-stepped sinusoidal waveforms from the twisted pair lines;
   a means for processing received stair-stepped sinusoidal waveforms to square waves representing digital signals;
   a filtering means for filtering the received stair-stepped sinusoidal waveforms;
   a means for discriminating a valid received signal over noise by comparing an unvalidated received signal from the twisted pair lines against a predetermined threshold; and.
   a means for detecting when the valid received signal crosses a reference voltage level.

2. The transceiver of claim 1, wherein the filtering means is comprised of:
   a resistor, wherein the received signal is input to one end of the resistor;
   a first switch coupled to the other end of the resistor;
   a capacitor coupled to the first switch, wherein an output signal from the filtering means is taken from a node between the first switch and the capacitor;
   a second switch coupled to the node for determining whether the node is to be connected to an output of the filtering means.

3. The transceiver of claim 1 further comprising:
   a deglitching means coupled to the means for discriminating said valid received signal over noise for filtering out glitches in the valid received signal;
   a synchronizing means coupled to the deglitching means for synchronizing the valid received signal to an internal frequency of an expected data rate; and,
   an integrated dump means for integrating and dumping a synchronized valid received signal from the synchronizing means.

4. The transceiver of claim 3, wherein the plurality of current sources comprise sixteen current sources, wherein approximately 0.38, 1.08, 1.62, and 1.915 milliamperes of current are provided.

5. The transceiver of claim 4, wherein one cycle of the stair-stepped sinusoidal waveform comprises at least eight discrete potentials as sixteen separate steps.

6. The transceiver of claim 5, wherein the means for controlling the switching means is comprised of a plurality of shift registers, wherein a rate at which the shift registers are being docked determines a rate at which data is being transmitted.

7. The transceiver of claim 6 further comprising a biasing circuit for compensating common-mode drift of the twisted pair lines.

8. A network comprising:
   a plurality of intelligent cells for processing digital data;
   twisted pair lines interconnecting the plurality of intelligent cells;
   a transceiver coupled to each of the intelligent cells for transmitting data onto the twisted pair lines and receiving data from the twisted pair lines, wherein the data is represented by a sinusoidal waveform having a plurality of discrete potentials.

9. The network of claim 8, wherein the transceiver comprises:
a termination resistor coupled across the twisted pair lines;
a plurality of current sources for providing a plurality of different amounts of current;
a plurality of switches coupled to the current sources for directing the direction and amount of current flowing through the termination resistor; and,
a plurality of shift registers for controlling operation of the switches according to data to be transmitted, wherein the direction and amounts of current flowing through the termination resistor produce the discrete potentials of the sinusoidal waveform.

10. The network of claim 9 further including a lowpass filter comprising:
resistor, one end of which is coupled to the twisted pair lines;
a capacitor coupled to ground;
a switch coupled between the other end of the resistor and the capacitor; and,
a line coupled between the switch and the capacitor, wherein a filtered signal from the lowpass filter resides on the line.

11. The network of claim 10, wherein the capacitor comprises a metal oxide semiconductor device.

12. The network of claim 10 further comprising a compensation means for maintaining a common-mode signal across the twisted pair lines at a pre-determined potential.

13. The network of claim 12 further comprising:
a zero-crossing comparator coupled to the lowpass filter for detecting when a received signal crosses a reference potential;
a hysteresis comparator coupled to the lowpass filter for distinguishing a valid received signal from noise;
a deglitcher coupled to the hysteresis comparator for filtering out spikes from the valid received signal;
a phase lock loop coupled to the deglitcher for synchronizing the valid received signal to an internal clock frequency; and,
an integrate and dump circuit coupled to the phase lock loop for filtering the valid received signal.

14. The network of claim 13, wherein the discrete potentials include approximately 500, 462, 353.5, and 191.5 millivolts.

15. The network of claim 13, wherein the digital data is encoded by implementing a Manchester encoding scheme.

16. The network of claim 13, wherein a transmission data rate is controlled by changing a clock frequency to the plurality of shift registers.

17. In a network having a plurality of nodes interconnected by a transmission medium, a method of transmitting and receiving signals between the nodes as sinusoidal waveforms having discrete potentials, the method comprising the steps of:
supplying a plurality of different amounts of current through a termination of the transmission medium;
controlling the amount of current flowing through the termination to produce discrete potentials across the termination, wherein the potentials correspond to a sinusoidal waveform, wherein the sinusoidal waveform represents one bit of information;
propagating the potentials from a first one of the nodes to a second one of the nodes over the medium;
the second one of the nodes converting a received sinusoidal waveform having discrete potentials into the bit of information transmitted by the first one of the nodes.

18. The method of claim 17 further comprising the step of filtering the received sinusoidal waveform by implementing a resistor and capacitor network.

19. The method of claim 18 further comprising the step of setting a common-mode potential of the transmission medium to a first reference potential.

20. The method of claim 19, wherein the reference potential is approximately half of a supply potential.

21. The method of claim 19 wherein the converting step is comprised of the steps of:
comparing the received waveform to a pre-determined threshold;
detecting when the received waveform crosses a second reference potential;
generating an edge of a square wave when the received waveform exceeds the pre-determined threshold and crosses the second potential.

22. The method of claim 21, wherein the transmission medium comprises twisted pair lines.

* * * * *

UNITED STATES PATENT AND TRADEMARK OFFICE
CERTIFICATE OF CORRECTION

PATENT NO. : 5,408,497
DATED : April 18, 1995
INVENTOR(S) Donald D. Baumann, et. al.

It is certified that error appears in the above-indentified patent and that said Letters Patent is hereby corrected as shown below:

Column 5, Line 44:    Delete "32 1"      Insert in place thereof --321--
Column 6, Line 10:    Delete "556"       Insert in place thereof --557--
Column 6, Line 48:    Delete "15B"       Insert in place thereof --5B--
Column 6, Line 57:    Delete "150"       Insert in place thereof --50--
Column 10, Line 54:   Delete "docked"    Insert in place thereof --clocked--

Signed and Sealed this

Twenty-sixth Day of September, 1995

Attest:

BRUCE LEHMAN

Attesting Officer    Commissioner of Patents and Trademarks